US009460897B2

(12) United States Patent
Katsunuma

(10) Patent No.: US 9,460,897 B2
(45) Date of Patent: Oct. 4, 2016

(54) PLASMA ETCHING METHOD AND PLASMA ETCHING APPARATUS

(71) Applicant: TOKYO ELECTRON LIMITED, Tokyo (JP)

(72) Inventor: Takayuki Katsunuma, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/664,510

(22) Filed: Mar. 20, 2015

(65) Prior Publication Data

US 2015/0294841 A1  Oct. 15, 2015

(30) Foreign Application Priority Data

Apr. 9, 2014 (JP) .................................. 2014-080592

(51) Int. Cl.
*H01J 37/32* (2006.01)
*H01L 21/02* (2006.01)

(52) U.S. Cl.
CPC .... *H01J 37/32477* (2013.01); *H01J 37/32045* (2013.01); *H01L 21/02115* (2013.01)

(58) Field of Classification Search
CPC ................... H01J 37/32477; H01J 37/32045; H01L 21/02115
See application file for complete search history.

(56) References Cited

U.S. PATENT DOCUMENTS

2011/0065049 A1*  3/2011  Kushibiki ............. G03F 7/0045
                                                        430/313

FOREIGN PATENT DOCUMENTS

JP        2007-59666 A    3/2007

* cited by examiner

*Primary Examiner* — Nadine Norton
*Assistant Examiner* — Mahmoud Dahimene
(74) *Attorney, Agent, or Firm* — Rothwell, Figg, Ernst & Manbeck, P.C.

(57) ABSTRACT

Provided is a plasma etching method of etching OCOC film in which HTO films and carbon films are alternately laminated by plasma of mixed gas containing first CF-based gas or second CF-based gas and oxygen gas using a silicon film formed on OCOC film as a mask. The etching of OCOC film includes a first etching process of etching a region spanning from the top surface to the middle of OCOC film by plasma of mixed gas containing first CF-based gas having a predetermined ratio of content of carbon to content of fluorine and oxygen gas and a second etching process of etching a region spanning from the middle of OCOC film to the lowest layer by plasma of mixed gas containing second CF-based gas having a ratio of content of carbon to content of fluorine, which is higher than the predetermined ratio of first CF-based gas, and oxygen gas.

15 Claims, 11 Drawing Sheets

| FLOW RATE OF O2 GAS | 0sccm | 50sccm | 200sccm |
|---|---|---|---|
| ETCHING RATE OF OCOC FILM | 113.6nm/M | 131.7nm/M | 154.1nm/M |
| SELECTION RATIO OF OCOC FILM TO SILICON FILM | 2.3 | 1.4 | 3.7 |
| DEGREE OF SHOULDER CUTTING OF SILICON MASK | 162.5° | 156.5° | 148.0° |
| DEGREE OF ROUGHNESS OF INNER WALL OF GROOVE | GOOD | GOOD | GOOD |

| FLOW RATE OF O2 GAS | 28sccm | 75sccm | 150sccm |
|---|---|---|---|
| ETCHING RATE OF OCOC FILM | 120.1nm/M | 161.3nm/M | 166.9nm/M |
| SELECTION RATIO OF OCOC FILM TO SILICON FILM | 2.1 | 2.6 | 4.2 |
| DEGREE OF SHOULDER CUTTING OF SILICON MASK | 141.5° | 136.5° | 136.5° |
| DEGREE OF ROUGHNESS OF INNER WALL OF GROOVE | BAD | BAD | BAD |

PLASMA ETCHING METHOD AND PLASMA ETCHING APPARATUS

CROSS-REFERENCE TO RELATED APPLICATIONS

This application is based on and claims priority from Japanese Patent Application No. 2014-080592, filed on Apr. 9, 2014, with the Japan Patent Office, the disclosure of which is incorporated herein in its entirety by reference.

TECHNICAL FIELD

Various aspects and exemplary embodiments of the present disclosure are related to a plasma etching method and a plasma etching apparatus.

BACKGROUND

When a trench for a dual damascene structure is formed on an insulation layer made of, for example, SiOC and formed on an underlying layer made of, for example, SiCN, the insulation layer is etched by plasma of a fluorine-based gas such as, for example, $C_4F_8$, using a photoresist as a mask to form a via hole on the insulation layer. Also, after an organic material is deposited in the via hole to protect the underlying layer at the bottom of the via hole, the insulation layer is etched by plasma of a fluorine-based gas such as, for example, $CF_4$, using a hard mask for trench formation which is made of, for example, TiN, to form the trench for the dual damascene structure. See, for example, Japanese Patent Laid-Open Publication No. 2007-59666.

SUMMARY

According to one aspect of the present invention, there is provided plasma etching method for etching a processing target film, in which an oxide film and a carbon film are alternately laminated, by plasma of a mixed gas containing a first CF-based gas or a second CF-based gas and oxygen gas, using a silicon film formed on the processing target film as a mask. The plasma etching method includes: performing first etching to etch the processing target film to a middle thereof by plasma of a mixed gas containing the first CF-based gas, in which a content ratio of C (carbon) in relation to F (fluorine) is predetermined, and oxygen gas; and performing second etching to etch the processing target film from the middle thereof by plasma of the mixed gas containing the second CF-based gas, in which a content ratio of C (carbon) in relation to F (fluorine) is higher than the predetermined ratio of the first CF-based gas.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
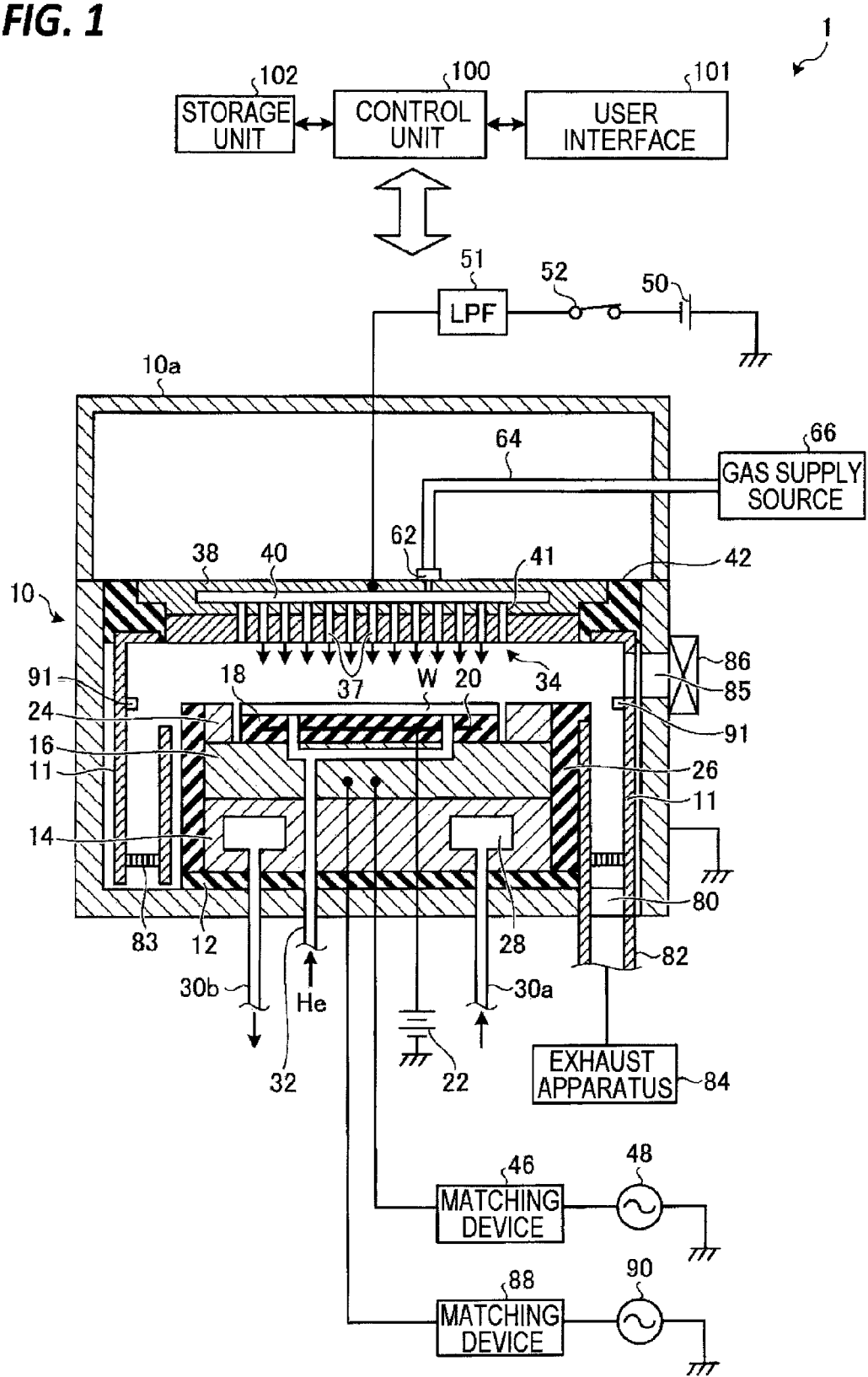
FIG. 1 is a vertical cross-sectional view illustrating an exemplary plasma etching apparatus according to an exemplary embodiment.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

In a process of etching a $SiO_2$ film by plasma of a mixed gas containing a CF-based gas, when ion bombardment is applied to a CF polymer layer formed on the $SiO_2$, a chemical reaction progresses by mixing action so that $SiO_2$ and CF are turned into $SiF_4$ or COx and gasified. Here, even if O (oxygen) in $SiO_2$ turns C (carbon) into COx to be gasified on the $SiO_2$ film, C is deposited on a photoresist containing a large amount of carbon or an underlying layer formed of Si (silicon). Since the deposited C acts as a protective film against the ion bombardment, a high etching selectivity of $SiO_2$ in relation to the photoresist and a high etching selectivity of $SiO_2$ in relation to the underlying layer formed by Si may be obtained.

In the meantime, when the processing target film, in which an oxide film and a carbon film are alternately laminated, is etched, the $SiO_2$ film and the carbon film are needed to be etched in accordance with the etching selectivity of $SiO_2$ and carbon film in relation to Si. However, when the etching selectivity of $SiO_2$ in relation to Si becomes increase by the process with above description, it becomes unable to etch the carbon film.

Further, when the processing target film, in which the $SiO_2$ film and the carbon film are alternately laminated, is etched by plasma of the mixed gas containing the CF-based gas, micro-trenches may be generated on the bottom of a trench formed by etching, or roughness may be generated on a sidewall of the trench.

In one exemplary embodiment, a plasma etching method disclosed herein etches a processing target film, in which an oxide film and a carbon film are alternately laminated, by plasma of a mixed gas containing a first CF-based gas or a second CF-based gas and oxygen gas, using a silicon film formed on the processing target film as a mask. The plasma etching method includes: performing first etching to etch the processing target film to a middle thereof by plasma of a mixed gas containing the first CF-based gas, in which a content ratio of C (carbon) in relation to F (fluorine) is predetermined, and oxygen gas; and performing second etching to etch the processing target film from the middle thereof by plasma of the mixed gas containing the second CF-based gas, in which a content ratio of C (carbon) in relation to F (fluorine) is higher than the predetermined ratio of the first CF-based gas.

In one exemplary embodiment of the plasma etching method, the processing target film includes an oxide film formed on a lowermost layer thereof. The first etching is performed to the middle of a lowermost carbon film among a plurality of carbon films included in the processing target film, and then, the second etching is performed from the middle of the lowermost carbon film to the oxide film of the lowermost layer.

In one exemplary embodiment of the plasma etching method, a plurality of oxide films and a plurality of carbon films are alternately laminated in the processing target film. The processing target film is etched by alternately repeating the first etching process and the second etching process plural times in the etching of the processing target film.

In one exemplary embodiment of the plasma etching method, the plurality of oxide films may be etched by the first etching and the plurality of carbon films may be etched by the second etching in the etching of the processing target film.

In one exemplary embodiment of the plasma etching method, the content ratio of C (carbon) in relation to F (fluorine) in the first CF-based gas may be 0.33 or less.

In one exemplary embodiment of the plasma etching method, the content ratio of C (carbon) in relation to F (fluorine) in the second CF-based gas may be 0.33 or more.

In one exemplary embodiment of the plasma etching method, the second etching may be performed under a condition in which an etching rate of the carbon film is higher than that of the oxide film.

In one exemplary embodiment of the plasma etching method, when the first CF-based gas is contained in the mixed gas, a flow rate of the oxygen gas may be 1.0 or more times a flow rate of the first CF-based gas, and when the second CF-based gas is contained in the mixed gas, a flow rate of the oxygen gas may be 5.0 or more times a flow rate of the second CF-based gas.

In one exemplary embodiment of the plasma etching method, the first CF-based gas may be $CF_4$ gas.

In one exemplary embodiment of the plasma etching method, the second CF-based gas may be any one of $C_4F_6$ gas, $C_4F_8$ gas, and $C_5F_8$ gas.

In one exemplary embodiment, a plasma etching apparatus disclosed herein includes: a processing chamber configured to perform a plasma etching processing on a processing target film therein; an exhaust unit configured to reduce pressure within the processing chamber; a gas supply unit configured to supply a gas into the processing chamber; and a control unit configured to execute the plasma etching method described above.

According to various aspects and exemplary embodiments of the present disclosure, a plasma etching method and a plasma etching apparatus capable of forming a trench having less micro-trenches or less roughness on a sidewall, in the processing target film in which an oxide film and a carbon film are alternately laminated, are implemented.

Hereinafter, descriptions will be made on exemplary embodiments of the plasma etching method and the plasma etching apparatus of the present disclosure with reference to the accompanying drawings. The present disclosure is not limited to the exemplary embodiments. Further, respective exemplary embodiments may be appropriately combined without being inconsistent with processing contents.

[Configuration of Plasma Etching Apparatus 1]

FIG. 1 is a vertical cross-sectional view illustrating an exemplary plasma etching apparatus 1 according to an exemplary embodiment. The plasma etching apparatus 1 of the exemplary embodiment is configured as a capacitively coupled parallel plate-type plasma etching apparatus and includes a substantially cylindrical chamber (processing container) 10 made of, for example, aluminum having an anodized surface. The chamber 10 is grounded for safety.

A columnar susceptor support 14 is disposed on the bottom portion of the chamber 10 through an insulation plate 12 made of, for example, ceramics, and a susceptor 16 made of, for example, aluminum, is provided on the susceptor support 14. The susceptor 16 constitutes a lower electrode, and a wafer W is disposed on the susceptor 16 as a processing target substrate. A processing target film is formed on the wafer W as an etching target of the present disclosure.

An electrostatic chuck 18 is provided on the top surface of the susceptor 16 so as to hold the wafer W by an electrostatic force. The electrostatic chuck 18 has a structure in which an electrode 20 made of a conductive film is interposed between insulation layers made of a dielectric material such as, for example, $Al_2O_3$. The electrode 20 is electrically connected to a DC power supply 22. Also, the wafer W is held by the electrostatic chuck 18 by an electrostatic force such as a Coulomb force generated by a DC voltage from the DC power supply 22.

A focus ring 24 made of, for example, silicon is disposed on the top surface of the susceptor 16 around the electrostatic chuck 18 so as to improve etching uniformity. A cylindrical side-wall member 26 made of, for example, quartz, is provided on the side surfaces of the susceptor 16 and the susceptor support stand 14.

A coolant chamber 28 is provided, for example, circumferentially inside of the susceptor support 14. A coolant having a predetermined temperature, for example, cooling water, is circulated to be supplied to the coolant chamber 28 through pipes 30a and 30b from a chiller unit (not illustrated) provided outside, and a processing temperature of the wafer W on the susceptor 16 may be controlled by the temperature of the coolant.

Further, a cold heat transmission gas (cooling gas), for example, He gas, is supplied to a space between the top surface of the electrostatic chuck 18 and a backside of the wafer W from a heat transfer gas supply unit (not illustrated) through a gas supply line 32. With this configuration, the wafer W may be controlled to a predetermined temperature.

An upper electrode 34 is provided above the susceptor 16 which is the lower electrode so as to face in parallel with the susceptor 16. Also, plasma is generated in a space between the upper electrode 34 and the susceptor (the lower electrode) 16.

The upper electrode 34 is supported on an upper portion of the chamber 10 through an insulating shielding member 42 and forms a surface facing the susceptor 16. Further, a plurality of gas injection holes 37 are provided on the surface of the upper electrode 34. Further, the upper electrode 34 includes an electrode support 38 with a water cooling structure (not illustrated) made of a conductive material such as, for example, aluminum. A gas diffusion chamber 40 is provided inside of the electrode support 38 and a plurality of gas supply holes 41 connecting with the gas injection holes 37 extend downwardly from the gas diffusion chamber 40.

A gas introduction port 62 is formed in the electrode support 38 so as to supply a processing gas into the gas diffusion chamber 40, a gas supply pipe 64 is connected to the gas introduction port 62, and a gas supply source 66 is connected to the gas supply pipe 64 so as to supply a gas needed for a processing. A plurality of gas pipes are connected to the gas supply pipe 64 and a flow rate controller and an opening/closing valve (all are not illustrated) are provided on these gas pipes. Also, the gas needed for the processing is supplied from the gas supply source 66 to the gas diffusion chamber 40 through the gas supply pipe 64 and ejected into a plasma generation space through the gas supply holes 41 and the gas injection holes 37 in a shower-like. That is, the upper electrode 34 functions as a shower head for supplying the processing gas.

A variable DC power supply 50 is electrically connected to the upper electrode 34 through a low pass filter (LPF) 51. The variable DC power supply 50 applies a negative voltage on the upper electrode 34. Power feeding from the variable DC power supply 50 may be turned ON/OFF by a switch 52. The LPF 51 traps high frequency signals from a first and a second high frequency power sources to be described later and is appropriately configured as an LR filter or an LC filter.

A cylindrical chamber 10a is provided on the upper portion of the chamber 10 to extend from the sidewall of the chamber 10 to a location higher than the height of the upper electrode 34.

A first high frequency power source 48 is electrically connected to the susceptor 16 which is the lower electrode through a first matching device 46. The first high frequency power source 48 outputs a high frequency power having a frequency ranging from 27 MHz to 100 MHz, for example, a frequency of 40.68 MHz. The first matching device 46 matches load impedance with internal (or output) impedance of the first high frequency power source 48 and functions to match the output impedance of the first high frequency power source 48 with the load impedance when plasma is generated in the chamber 10.

Further, a second high frequency power source 90 is also electrically connected to the susceptor 16 which is the lower electrode through a second matching device 88. A high frequency power is supplied from the second high frequency power source 90 to the susceptor 16 which is the lower electrode such that a high frequency bias is applied to the wafer W and ions are introduced onto the surface of the wafer W. The second high frequency power source 90 outputs a high frequency power having a frequency ranging from 400 KHz to 20 MHz, for example, a frequency of 13.56 MHz. The second matching device 88 matches load impedance with internal (or output) impedance of the second high frequency power source 90 and functions to match the output impedance of the second high frequency power source 90 with the impedance of load including plasma within the chamber 10 when plasma is generated in the chamber 10.

An exhaust port 80 is provide in the bottom portion of the chamber 10 and an exhaust apparatus 84 is connected to the exhaust port 80 through an exhaust pipe 82. The exhaust apparatus 84 includes a vacuum pump such as, for example, a turbo molecular pump and a dry pump to be capable of reducing the pressure within the chamber 10 to a desired vacuum level. Further, a wafer W carry-in/carry-out port 85 is provided through the sidewall of the chamber 10 and configured to be opened/closed by a gate valve 86. Further, a deposition shield 11 is removably provided in the chamber 10 so as to prevent by-product of etching (deposition precursor) from being adhered on an inner wall of the chamber 10. That is, the deposition shield 11 has a function of the chamber wall. Further, the deposition shield 11 is also provided on the outer periphery of the side-wall member 26. An exhaust plate 83 is provided between the chamber wall side of the bottom portion of the chamber 10 and the deposition shield 11 of the side-wall member 26 side of the deposition shield 11 at the bottom portion of the chamber 10. An aluminum material covered with ceramics such as, for example, $Y_2O_3$, may be appropriately used for the deposition shield 11 and the exhaust plate 83.

A conductive member (GND block) 91 serially connected to the ground is provided on a portion of the deposition shield 11, which forms the inner wall of the chamber 10, at a height which is substantially the same as that of the wafer W, thereby achieving an abnormal electric discharge prevention effect. Further, the location of the conductive member 91 is not limited to the location illustrated in FIG. 1, if the conductive member 91 is provided in a plasma generation region. For example, the conductive member 91 may be provided on a portion of the side-wall member 26 side of the deposition shield 11. Alternatively, the conductive member 91 may be provided on the periphery of the upper electrode 34, for example, in a ring shape outside the upper electrode 34. Further, the conductive member 91 may be disposed at a location where the conductive member 91 is not directly exposed to plasma, for example, on an exhaust plate 83 at the bottom portion of the chamber and below the lower electrode.

Respective component units of the plasma etching apparatus 1 such as, for example, a power supply system, a gas supply system, and a driving system as well as the first high frequency power source 48, the second high frequency power source 90, the first matching device 46, and the second matching apparatus 88 are configured to be connected and to be controlled by a control unit (an entire control apparatus) 100, which includes a microprocessor (computer). Further, the control unit 100 is connected with a user interface 101 configured as, for example, a keyboard, through which an operator performs an input manipulation of commands for managing the plasma etching apparatus 1, or a display which visualizes and displays an operation situation of the plasma etching apparatus 1.

Further, the control unit 100 is connected with a storage unit 102 in which a control program for implementing various processings executed in the plasma etching apparatus 1 by the control unit 100 or a program causing the respective constitutional units to execute the processing according to a processing condition, that is, a processing recipe is stored. The processing recipe is stored in a central storage medium of the storage unit 102. The storage medium may be a hard disk or a semiconductor memory, or a portable medium such as, for example, a CD-ROM, a DVD, or a flash memory. Further, the control program or the processing recipe may be adapted to be appropriately transmitted from other apparatus to the plasma etching apparatus 1 through, for example, a dedicated line.

When an arbitrary processing recipe is invoked from the storage unit 102 according to an instruction from the user interface 101 and executed by the control unit 100, a desired processing is executed in the plasma etching apparatus 1.

For example, the control unit 100 controls respective units of the plasma etching apparatus 1 so as to execute a plasma etching method to be described later. An exemplary plasma etching method will be described in detail. The control unit 100 controls respective units such that a processing target film in which an oxide film and a carbon film are alternately laminated is etched by plasma of a mixed gas containing a CF-based gas using a silicon film formed on the processing target film as a mask. In this case, the control unit 100 controls respective units such that the processing target film is etched to the middle thereof by plasma of a mixed gas containing a first CF-based gas, in which a content ratio of C (carbon) in relation to F (fluorine) is predetermined, and oxygen gas, and the processing target film is etched from the middle thereof by plasma of a mixed gas containing a second CF-based gas, in which a content ratio of C (carbon) is higher than the predetermined content ratio in the first CF-based gas, and oxygen gas.

[Configuration of Wafer W]

Figure 2:
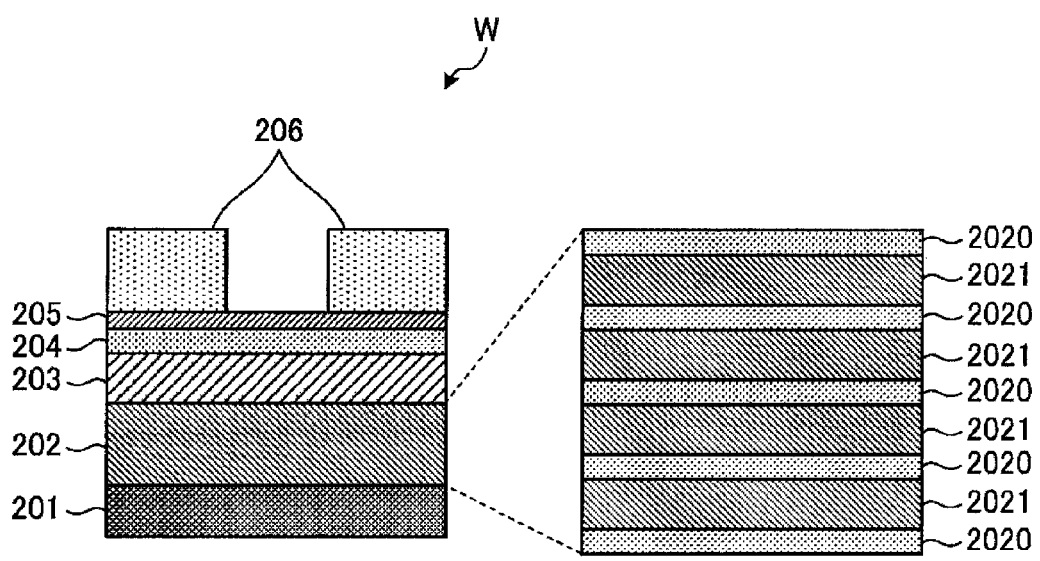
FIG. 2 is a diagram for explaining an exemplary structure of a wafer W etched by the plasma etching apparatus according to the exemplary embodiment.

FIG. 2 is a diagram for explaining an exemplary structure of a wafer W etched by the plasma etching apparatus 1 according to an exemplary embodiment. In the present embodiment, the wafer W having the structure illustrated in FIG. 2 is used as an example.

In the wafer W, on a silicon substrate (Si-sub) 201, for example, an OCOC film 202, a silicon (Si) film 203, a high temperature oxide (HTO) film 204, a bottom anti-reflective coating (BARC) 205, and a photoresist PR 206 are sequentially laminated, as illustrated in FIG. 2, and then a predetermined pattern is formed on the photoresist 206 by photolithography.

The OCOC film 202 has, for example, a structure in which HTO films 2020 and carbon films 2021 are alternately laminated, as illustrated in FIG. 2. In the present exemplary embodiment, the HTO films 2020 are provided on the top and the bottom in the OCOC film 202. Further, in the present exemplary embodiment, the OCOC film 202 is provided with, for example, five layers of HTO films 2020 and, for example, four layers of carbon films 2021. However, the number of laminated layers of HTO films 2020 and carbon films 2021 included in the OCOC film 202 is not limited thereto and may be more than or less than the number of laminated layers illustrated in FIG. 2.

In the present exemplary embodiment, the thickness of the OCOC film 202 is, for example, about 305 nm, the thickness of each of the HTO films 2020 included in the OCOC film 202 is, for example, about 25 nm, and the thickness of each of the carbon films 2021 included in the OCOC film 202 is, for example, about 45 nm. Further, in the present exemplary embodiment, the thickness of the silicon film 203 is, for example, about 300 nm and the thickness of the HTO film 204 is, for example, about 150 nm. Further, in the present exemplary embodiment, the thickness of the BARC 205 is, for example, from about 70 nm to about 100 nm, and the thickness of the photoresist 206 is, for example, from about 410 nm to about 510 nm.

[Exemplary Embodiment of Plasma Etching Method]

Figure 3:
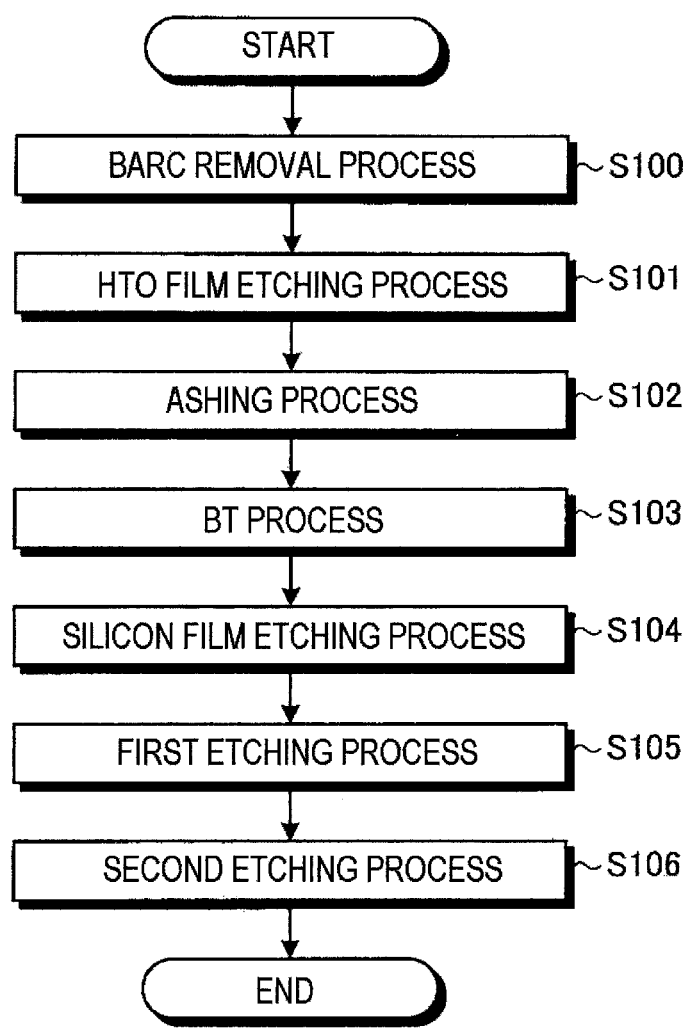
FIG. 3 is a flowchart illustrating an exemplary sequence of a plasma etching method according to an exemplary embodiment.
Figure 4:
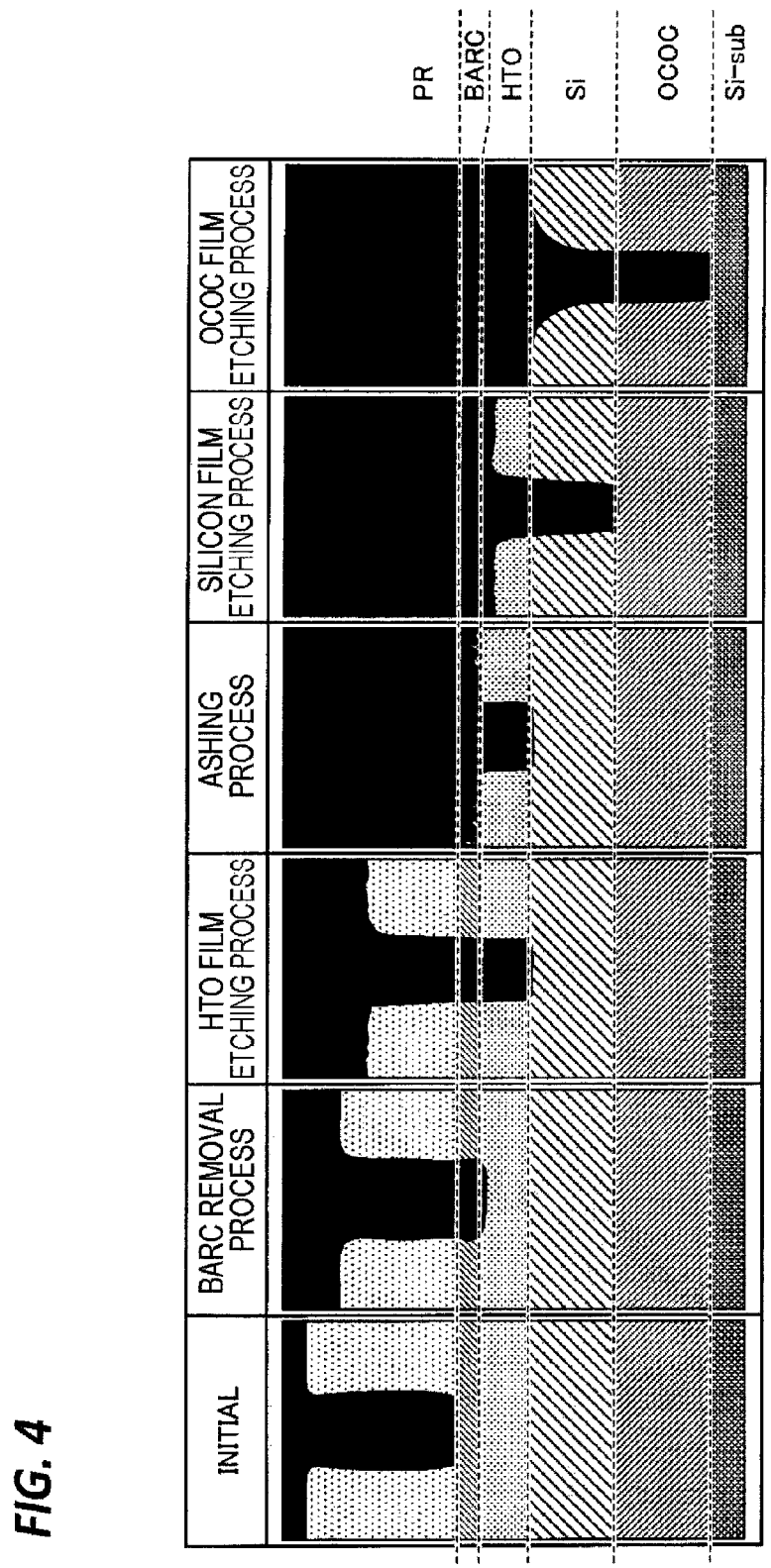
FIG. 4 is a diagram illustrating exemplary cross-sections of a wafer W after respective processes were executed.

Next, descriptions will be made on respective processes of the plasma etching method of the present exemplary embodiment. FIG. 3 is a flowchart illustrating an exemplary sequence of a plasma etching method according to an exemplary embodiment. FIG. 4 is a diagram illustrating exemplary cross-sections of a wafer W after respective processes were executed.

In the plasma etching method of the present exemplary embodiment, first, the wafer W, which is a processing target object, is carried into the chamber 10 and disposed on the susceptor 16. At this step, the cross-section of the wafer W is, for example, in a state represented as an image in INITIAL section of FIG. 4. In a test, the thickness of the photoresist 206 was about 476 nm and the critical dimension (CD) of the pattern formed on the photoresist 206 was about 218 nm, at this step.

Then, the control unit 100 depressurizes the inside of the chamber 10 through the exhaust port 80 by the vacuum pump of the exhaust apparatus 84 to a predetermined pressure and supplies a mixed gas containing a CF-based gas into the chamber 10 from the gas supply source 66 so as to execute a BARC removal process (step S100).

The control unit 100 executes the BARC removal process at step S100 with the following condition, for example.

Pressure within chamber 10: 30 mT

First high frequency power (40.68 MHz) to be supplied to lower electrode: 400 W

Second high frequency power (13.56 MHz) to be supplied to lower electrode: 0 W

Supplied gas and flow rate: $CF_4/O_2$=250/13 sccm Processing time: 60 seconds

After the BARC removal process illustrated at step S100 was executed, the cross-section of the wafer W is, for example, in a state represented as an image in BARC Removal Process section of FIG. 4. In the test, the thickness of the photoresist 206 was about 377 nm, the recess depth of the HTO film 204 was about 16 nm, and the critical dimension (CD) of the bottom of a formed trench was about 226 nm.

Next, the control unit 100 evacuates the inside of the chamber 10 and supplies the processing gas into the chamber 10 so as to execute an etching process of the HTO film 204 (step S101). For example, the control unit 100 supplies the mixed gas containing the CF-based gas into the chamber 10 from the gas supply source 66 so as to etch the HTO film 204 by plasma of the mixed gas containing the CF-based gas using the photoresist 206 as the mask, thereby making appearance of a surface of the silicon film 203 formed under the HTO film 204.

The control unit 100 executes the HTO removal process at step S101 with the following condition, for example.

Pressure within chamber 10: 25 mT

First high frequency power (40.68 MHz) to be supplied to lower electrode: 300 W

Second high frequency power (13.56 MHz) to be supplied to lower electrode: 750 W Supplied gas and flow rate: $CHF_3/CF_4/Ar/O_2$=240/180/400/10 sccm Processing time: 60 seconds After the HTO film 204 etching process illustrated at step S101 was performed, the cross-section of the wafer W is, for example, in a state represented as an image in Etching Process section the HTO film 204 of FIG. 4. In the test, the thickness of the photoresist 206 was about 294 nm, the recess depth of the silicon film 203 was about 12 nm, and the critical dimension (CD) of the bottom of the formed trench was about 194 nm.

Next, the control unit 100 evacuate the inside of the chamber 10 and supplies $O_2$ (oxygen) gas into the chamber 10 so as to execute an ashing process (step S102). For example, the control unit 100 supplies $O_2$ gas from the gas supply source 66 into the chamber 10 and exposes the wafer W to plasma of $O_2$ gas so as to remove the photoresist 206 and the BARC 205.

The control unit 100 executes the ashing process at step S102 with the following condition, for example.

Pressure within chamber 10: 20 mT

First high frequency power (40.68 MHz) to be supplied to lower electrode: 500 W

Second high frequency power (13.56 MHz) to be supplied to lower electrode: 0 W

Supplied gas and flow rate: $O_2$=400 sccm

Processing time: 40 seconds

After the ashing process illustrated at step S102 was performed, the cross-section of the wafer W is, for example, in a state represented as an image in Ashing Process section of FIG. 4. In the test, the thickness of the HTO film 204 was about 151 nm, the recess depth of the silicon film 203 was about 16 nm, and the critical dimension (CD) of the bottom of the formed trench was about 202 nm.

Next, the control unit 100 evacuates the inside of the chamber 10 and supplies a mixed gas containing a CF-based gas, for example, $CF_4$ gas and Ar (argon) gas into the chamber 10 to execute a break through (BT) process (step S103). For example, the control unit 100 supplies the mixed gas containing CF-based gas from the gas supply source 66 into the chamber 10 and exposes the wafer W to plasma of the mixed gas. In this manner, a natural oxide film formed on the surface of the silicon film 203 by the ashing process is removed.

The control unit 100 executes the BT process at step S103 with the following condition, for example.

Pressure within chamber 10: 20 mT

First high frequency power (40.68 MHz) to be supplied to lower electrode: 300 W

Second high frequency power (13.56 MHz) to be supplied to lower electrode: 0 W

Supplied gas and flow rate: $CF_4/Ar$=100/200 sccm

Processing time: 5 seconds

Next, the control unit 100 evacuates the inside of the chamber 10 and supplies a mixed gas containing Cl-based gas into the chamber 10 to execute an etching process of the silicon film 203 (step S104). For example, the control unit 100 supplies the mixed gas containing Cl-based gas from the gas supply source 66 into the chamber 10 and etches the silicon film 203 by plasma of the mixed gas using the HTO film 204 as a mask.

The control unit 100 executes the etching process of the silicon film 203 at step S104 with the following condition, for example.

Pressure within chamber 10: 80 mT

First high frequency power (40.68 MHz) to be supplied to lower electrode: 500 W

Second high frequency power (13.56 MHz) to be supplied to lower electrode: 100 W Supplied gas and flow rate: $Cl_2/Ar$=50/200 sccm Processing time: 126 seconds After the etching process of the silicon film 203 illustrated at step S104 was performed, the cross-section of the wafer W is, for example, in a state represented as an image in Etching Process section of the silicon film 203 of FIG. 4. In the experiment, the remaining thickness of the HTO film 204 was about 101 nm, the recess depth of the OCOC film 202 was about 4 nm, and the critical dimension (CD) of the bottom of the formed trench was about 143 nm.

Next, the control unit 100 evacuates the inside of the chamber 10 and supplies a mixed gas containing a first CF-based gas and oxygen gas into the chamber 10 to execute a first etching process of etching the OCOC film 202 by plasma of the mixed gas (step S105). In the first etching process, for example, the mixed gas containing the first CF-based gas and oxygen gas is supplied from the gas supply source 66 to the chamber 10 so as to etch the OCOC film 202 by plasma of the mixed gas using the silicon film 203 as a mask.

Here, in the present exemplary embodiment, the first CF-based gas refers to gas containing C (carbon) in a predetermined content ratio or less (e.g., 0.33 or less) in relation to F (fluorine). For example, $CF_4$ gas may be used as the first CF-based gas.

In the first etching process, for example, the gas supply source 66 is controlled such that the first CF-based gas is switched to a second CF-based gas in a step where the lowest oxide film and a portion of the carbon film of the OCOC film 202 are etched to the middle thereof. Then, a second etching process of etching a portion of the carbon film and the lowest oxide film within the OCOC film 202 by plasma of mixed gas containing second CF-based gas is executed (S106). In this case, in the second etching process, the portion of the carbon film and the lowest oxide film may be etched for a processing time during which roughness is not formed on the sidewall of the OCOC film 202 to expose silicon surface under the OCOC film 202. The processing time may be, for example, 40 milliseconds or less. Further, the processing time may be, for example, 30 milliseconds or less. Further, the etching by the second etching process may be performed with the condition that the etching rate of the carbon film is higher than that of the oxide film.

Here, the second CF-based gas has a content ratio C (carbon) in relation to F (fluorine) which is higher than that in the first CF-based gas, for example. The second CF-based gas refers to a gas which facilitates deposition of a CF-based material. Further, the second CF-based gas has a content ratio of C (carbon) in relation to F (fluorine) which is higher than 0.33, for example. For example, $C_4F_6$ gas, $C_4F_8$ gas, $C_5F_8$ gas, $CHF_3$ gas, or $CH_2F_2$ gas may be used as the second CF-based gas.

After the etching process of the OCOC film 202 illustrated at step S106 was performed, the cross-section of the wafer W is, for example, in a state represent as an image in Etching Process section of the OCOC film 202 of FIG. 4. In the test, the remaining thickness of the silicon film 203 was about 258 nm, the recess depth of the substrate 201 was about 4 nm, and the critical dimension (CD) of the bottom of the formed trench was about 147 nm.

[Flow Rate Ratios of First CF-Based Gas and $O_2$ Gas]

Figure 5:
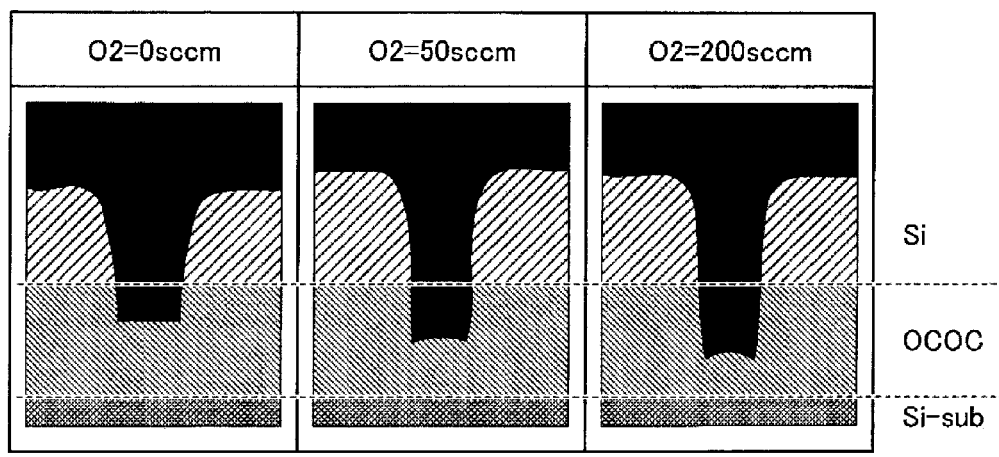
FIG. 5 is a diagram illustrating exemplary cross-sections of a wafer W in a case where etching was performed using plasma of a mixed gas containing $CF_4$ gas by changing a flow rate of $O_2$ gas.

Here, descriptions will be made on test results in a case where the OCOC film 202 is etched by plasma of the mixed gas containing the first CF-based gas. In the test, $CF_4$ gas was used as the first CF-based gas. FIG. 5 is a diagram illustrating exemplary cross-section of a wafer W in a case where etching was performed using plasma of the mixed gas containing $CF_4$ gas by changing the flow rate of $O_2$ gas.

The test result illustrated in FIG. 5 was obtained with the following condition, except for a flow rate of $O_2$ gas.

Pressure within chamber 10: 25 mT
First high frequency power (40.68 MHz) to be supplied to lower electrode: 300 W
Second high frequency power (13.56 MHz) to be supplied to lower electrode: 750 W
Supplied gas and flow rate: $CF_4/Ar/O_2$=200/400/0, 50, 200 sccm
Processing time: 60 seconds Referring to the test result illustrated in FIG. 5, it can be seen that when the flow rate of $O_2$ gas is increased, the etching rate of the OCOC film 202 is increased. However, when the OCOC film 202 is etched by plasma of the mixed gas containing the first CF-based gas, a micro-trench is formed in the trench formed on the OCOC film 202. Also, it can be seen that the micro-trench tends to become larger when the flow rate of $O_2$ gas is increased.

Figure 6:
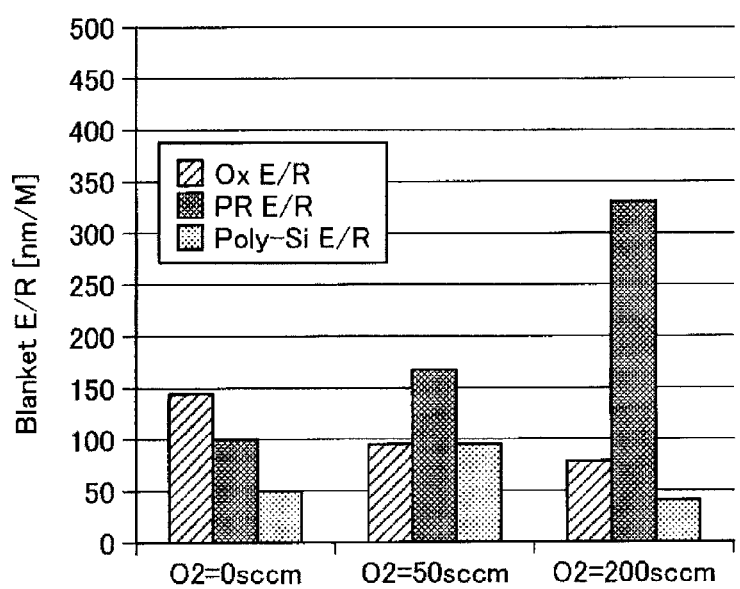
FIG. 6 is a graph illustrating exemplary etching rates of respective films in a case where etching was performed using plasma of a mixed gas containing $CF_4$ gas by changing the flow rate of $O_2$ gas.

FIG. 6 is a graph illustrating exemplary etching rates of respective films in a case where etching was performed using plasma of the mixed gas containing $CF_4$ gas by changing the flow rate of $O_2$ gas. In FIG. 6, "Ox E/R" indicates an etching rate of the HTO film 2020, "PR E/R" indicates an etching rate of the photoresist 206, and "Poly-Si E/R" indicates an etching rate of the silicon film 203.

Referring to FIG. 6, it can be seen that the etching rate of the photoresist 206 greatly increases as the flow rate of $O_2$ gas increases. It is considered that since carbon is a major component of the photoresist 206, the etching rate of the carbon film 2021 within the OCOC film 202 also greatly increases when the flow rate of $O_2$ gas increases. Further, referring to FIG. 6, it can be seen that even though the etching rate of the HTO film 2020 tends to slightly decrease as the flow rate of $O_2$ gas increases, the etching rate of the HTO film higher than that of the silicon film 203 is maintained. Also, since the increasing ratio of the etching rate of the photoresist 206 is greater than the decreasing ratio of the etching rate of the HTO film 2020, the etching selectivity with respect to the silicon film 203 tends to increase in terms of the entirety of the OCOC film 202 when the flow rate of $O_2$ gas increases.

Here, referring to FIG. 6, in a case where the flow rate of $O_2$ gas is 50 sccm, the etching rate of the silicon film 203 is slightly increased compared to a case where the flow rate of $O_2$ gas is 0 (zero), and when the flow rate of $O_2$ gas becomes 200 sccm, the etching rate of the silicon film 203 is decreased. That is, it can be seen that when a small amount of $O_2$ gas is added, the etching rate of the silicon film 203 tends to increase, and when a large amount of $O_2$ gas is added, the etching rate of the silicon film 203 tends to decrease.

It is considered that the etching rate of the silicon film 203 increases since the dissociation of $CF_4$ gas is facilitated when the small amount of $O_2$ gas is added. Also, it is considered that when the dissociation of $CF_4$ gas is accelerated, F radicals increase within the chamber 10 and thus, the etching rate of the silicon film 203 increases. In the meantime, when a large amount of $O_2$ gas is added, $CF_4$ gas is diluted by added $O_2$ gas and thus, the density of F radicals becomes lower within the chamber 10. Therefore, it is considered that the etching rate of the silicon film 203 decreases.

Accordingly, it is considered that when a large amount of $O_2$ gas is added, it is possible to lower the etching rate of the silicon film 203 while increasing the etching rate of the carbon film 2021. In this manner, it is considered that when a large amount of $O_2$ gas is added, the etching selectivity of the OCOC film 202 to the silicon film 203 may increase.

Figures 7, 8:
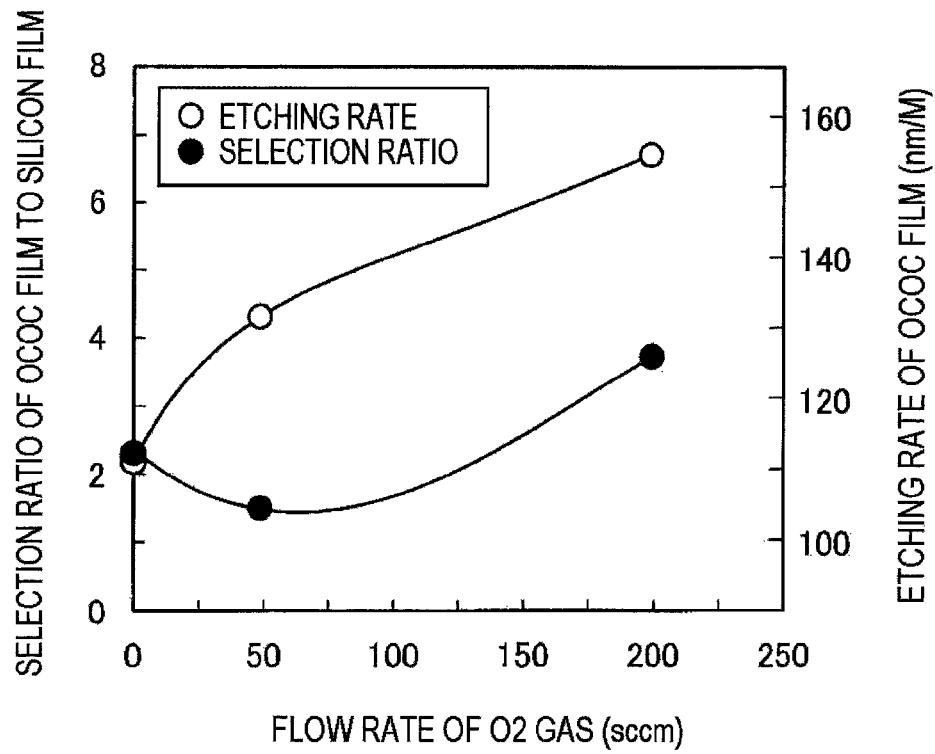
FIG. 7 is a table illustrating exemplary test results in a case where etching was performed using plasma of the mixed gas containing $CF_4$ gas by changing the flow rate of $O_2$ gas.
FIG. 8 is a graph illustrating an exemplary tendency of the test results in a case where etching was performed using plasma of the mixed gas containing $CF_4$ gas by changing the flow rate of $O_2$ gas.

By calculating etching rate of the OCOC film 202 and the etching selectivity of the OCOC film 202 in relation to the silicon film 203 for each flow rate of $O_2$ gas based on the test results of FIG. 6, the results illustrated in, for example, FIG. 7 were obtained. FIG. 7 is a table illustrating exemplary test results in a case where etching was performed using plasma of the mixed gas containing $CF_4$ gas by changing the flow rate of $O_2$ gas. FIG. 8 is a graph illustrating exemplary tendencies of test results in a case where etching was performed using plasma of the mixed gas containing $CF_4$ gas by changing the flow rate of $O_2$ gas.

As is evident from the computation result of FIG. 7, when the flow rate of $O_2$ gas increases, the etching rate of the OCOC film 202 increases. In the meantime, when the flow rate of $O_2$ gas increases, the etching selectivity of the OCOC film 202 in relation to the silicon film 203 temporarily decreases and thereafter, increases. As a result, it can be seen that when the flow rate of $O_2$ gas increases, the etching selectivity of the OCOC film 202 in relation to the silicon film 203 also tends to increase. Further, the etching selectivity of the OCOC film 202 in relation to the silicon film may be 2.5 or more. Further, the flow rate of $O_2$ gas may be 100 sccm or more when considering the etching rate of the OCOC film 202. Further, the flow rate of $O_2$ gas may be 150 sccm or more and 800 sccm or less.

Accordingly, the OCOC film 202 may be etched using the silicon film 203 as a mask by increasing the flow rate of $O_2$ gas in the etching by plasma of the mixed gas containing the first CF-based gas such as $CF_4$ gas. Further, the flow rate of $O_2$ gas may be higher than that of first CF-based gas such as $CF_4$ gas. Further, when considering a shoulder loss amount of the silicon film 203 serving as the mask during the etching of the OCOC film 202 and the degree of roughness of an inner wall surface of the trench, the flow rate of $O_2$ gas may be more than 0.5 times the flow rate of first CF-based gas such as, for example, $CF_4$ gas. Here, the shoulder loss amount becomes small as, for example, an angle between an inner wall of the trench and a sidewall of a layer which serves the mask becomes nearer to 180 degrees, thereby exhibiting that an influence imparted on the mask is small. Further, the flow rate of $O_2$ gas may be 0.75 or more times and 4.0 or less times the flow rate of the first CF-based gas. When the flow rate of $O_2$ gas is less than 0.5 times or more than 4.0 times the flow rate of the first CF-based gas, the oxide film is not etched and thus, the etching rate is reduced which causes a releasing property of the oxide film to be degraded. Further, the flow rate of $O_2$ gas may be 1.0 or more times the flow rate of the first CF-based gas.

Figure 9:
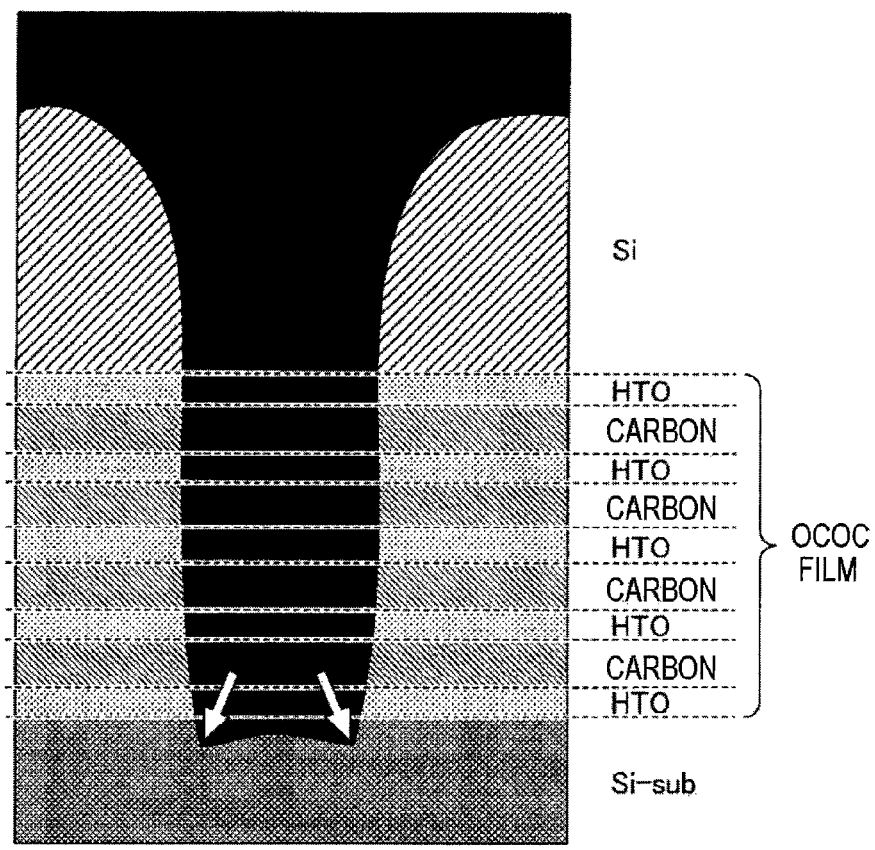
FIG. 9 is a diagram illustrating an exemplary cross-section of the wafer W in a case where etching was performed on the entirety of an OCOC film using plasma of the mixed gas containing $CF_4$ gas.

However, a large micro-trench is formed in the etching by plasma of the mixed gas containing $CF_4$ gas, for example, as illustrated in FIG. 9. FIG. 9 is a diagram illustrating an exemplary cross-section of a wafer W in a case where etching was performed on the entirety of the OCOC film 202 using plasma of a mixed gas containing $CF_4$ gas.

FIG. 9 illustrates an image of the cross-section of the wafer W etched by plasma of a mixed gas in which the flow rate of $O_2$ gas is 200 sccm. Conditions, except for the flow rate of $O_2$ gas, are the same as those explained with reference to FIG. 6. As is evident from FIG. 9, a large micro-trench is formed in the trench generated by the etching.

[Flow Rate Ratios of Second CF-Based Gas and $O_2$ Gas]

Figure 10:
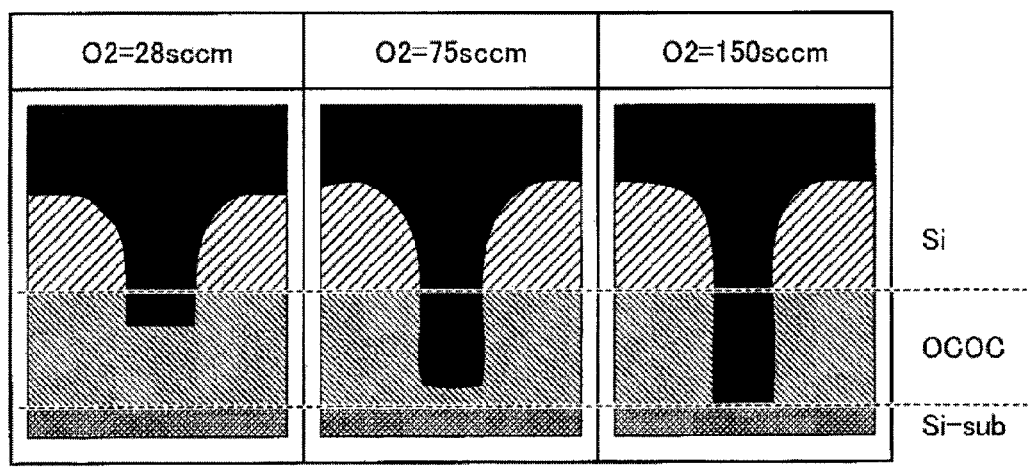
FIG. 10 is a diagram illustrating exemplary cross-sections of a wafer W in a case where etching was performed using plasma of a mixed gas containing $C_4F_8$ gas by changing the flow rate of $O_2$ gas.

Here, description will be made on test results for a case where the OCOC film 202 was etched by plasma of the mixed gas containing the second CF-based gas. In the test, $C_4F_8$ gas is used as the second CF-based gas. FIG. 10 is a diagram illustrating exemplary cross-sections of a wafer W in a case where the etching was performed using plasma of the mixed gas containing $C_4F_8$ gas by changing the flow rate of $O_2$ gas.

The test result illustrated in FIG. 10 was obtained with the following conditions, except for the flow rate of $O_2$ gas.

Pressure within chamber 10: 20 mT

Figures 11, 12:
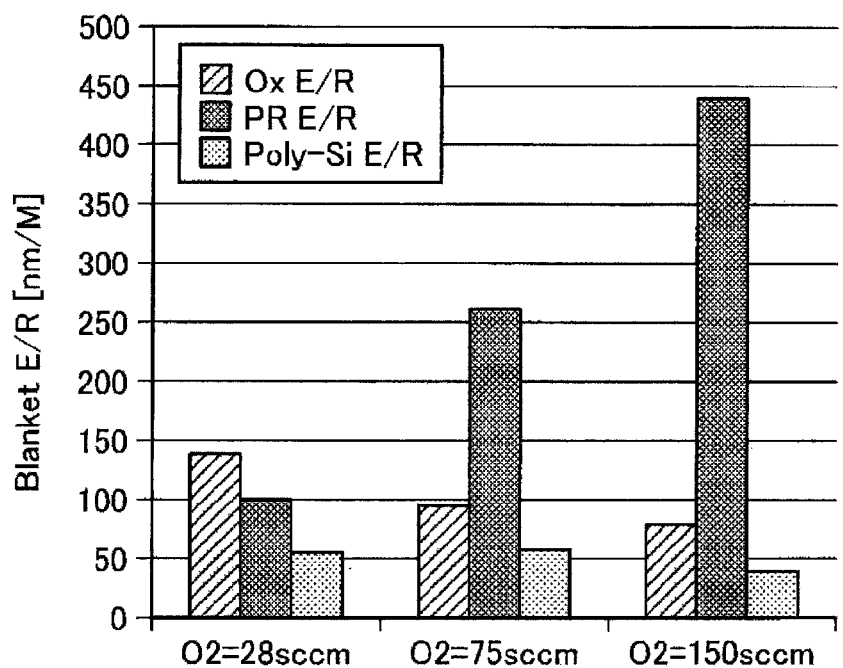
FIG. 11 is a graph illustrating exemplary etching rates of respective films in a case where etching was performed using plasma of the mixed gas containing $C_4F_8$ gas by changing the flow rate of $O_2$ gas.
FIG. 12 is a table illustrating exemplary test results in a case where etching was performed using plasma of the mixed gas containing $C_4F_8$ gas by changing the flow rate of $O_2$ gas.

First high frequency power (40.68 MHz) to be supplied to lower electrode: 2500 W Second high frequency power (13.56 MHz) to be supplied to lower electrode: 800 W Supplied gas and flow rate: $C_4F_8$/Ar/$O_2$=18/700/28, 75, 150 sccm Processing time: 60 seconds Referring to the result illustrated in FIG. 10, it can be seen that the etching rate of the OCOC film 202 increases as the flow rate of $O_2$ gas increases. FIG. 11 is a graph illustrating exemplary etching rates of respective films in a case where the etching was performed using plasma of mixed gas containing $C_4F_8$ gas by changing the flow rate of $O_2$ gas. In FIG. 11, "Ox E/R" indicates an etching rate of the HTO film 2020, "PR E/R" indicates an etching rate of the photoresist 206, and "Poly-Si E/R" indicates an etching rate of the silicon film 203.

Referring to FIG. 11, it can be seen that the etching rate of the photoresist 206 greatly increases as the flow rate of $O_2$ gas increases. It is considered that since carbon is a major component of the photoresist 206, when the flow rate of $O_2$ gas increases, the etching rate of the carbon film 2021 within the OCOC film 202 also greatly increases. Further, even though the etching rate of the HTO film 2020 tends to slightly decrease as the flow rate of $O_2$ gas increases, the etching rate of the HTO film 2020 is higher than that of the silicon film 203. Also, since the increasing ratio of the etching rate of the photoresist 206 is higher than the decreasing ratio of the etching rate of the HTO film 2020, when the flow rate of $O_2$ gas increases, the etching selectivity in relation to the silicon film 203 tends to increase in terms of the entirety of the OCOC film 202.

Here, referring to FIG. 11, in a case where the flow rate of $O_2$ gas is 75 sccm, the etching rate of the silicon film 203 slightly increases compared to a case where the flow rate of $O_2$ gas is 28 sccm, and when the flow rate of $O_2$ gas becomes 150 sccm, the etching rate of the silicon film 203 decreases. That is, it can be seen that when a small amount of $O_2$ gas is added, the etching rate of the silicon film 203 tends to increase and when a large amount of $O_2$ gas is added, the etching rate of the silicon film 203 tends to decrease even in the mixed gas containing $C_4F_8$ gas, similarly to the mixed gas containing $CF_4$ gas. It is considered that this tendency of the mixed gas containing $C_4F_8$ gas follows the same mechanism as that of the mixed gas containing $CF_4$ gas.

Figure 13:
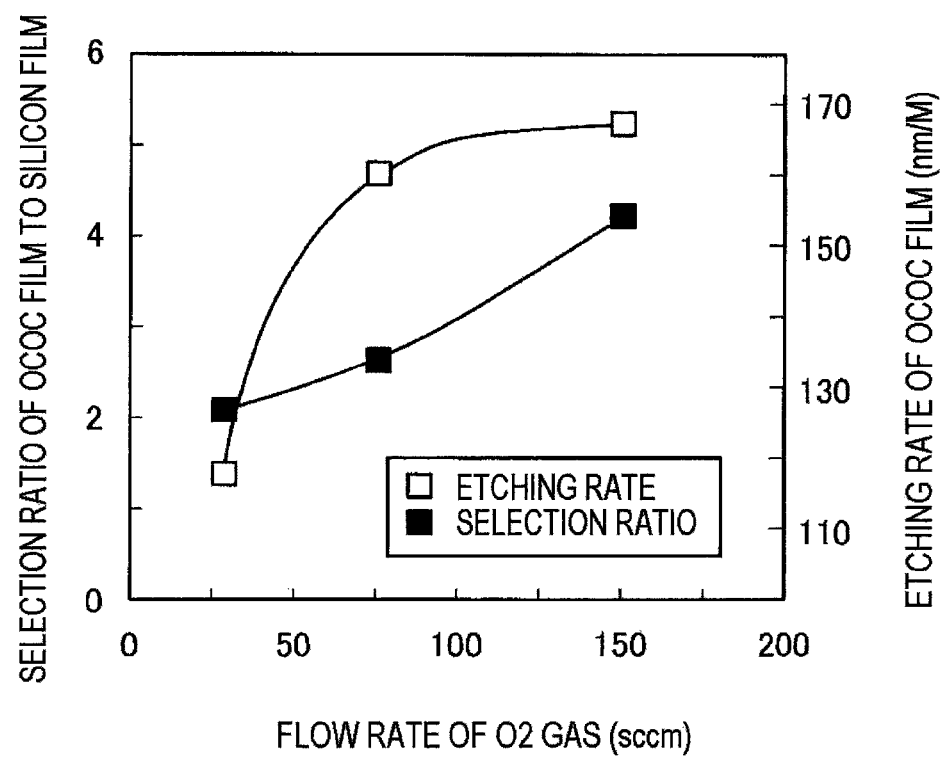
FIG. 13 is a graph illustrating exemplary tendencies of the test results in a case where etching was performed using plasma of the mixed gas containing $C_4F_8$ gas by changing the flow rate of $O_2$ gas.

By calculating the etching rate of the OCOC film 202 and the etching selectivity of the OCOC film 202 in relation to the silicon film 203 for each flow rate of $O_2$ gas based on test results of FIG. 11, results illustrated in, for example, FIG. 12 were obtained. FIG. 12 is a table illustrating exemplary test results in a case where etching was performed using plasma of the mixed gas containing $C_4F_8$ gas by changing the flow rate of $O_2$ gas. FIG. 13 is a graph illustrating exemplary tendencies of the experiment results in a case where etching was performed using plasma of the mixed gas containing $C_4F_8$ gas by changing the flow rate of $O_2$ gas.

As is evident from the computation result of FIG. 12, when the flow rate of $O_2$ gas increases, the etching rate of the OCOC film 202 increases. Regarding the etching selectivity of the OCOC film 202 in relation to the silicon film 203, it can be seen that even though the increasing ratio of the etching selectivity is low when a small amount of $O_2$ gas is added, the etching selectivity of the OCOC film 202 in relation to the silicon film 203 also tends to increase when the flow rate of $O_2$ gas increases.

Accordingly, the OCOC film 202 may be etched using the silicon film 203 as a mask by increasing the flow rate of $O_2$ gas in the etching by plasma of mixed gas containing second CF-based gas such as, for example, $C_4F_8$ gas. Further, the flow rate of $O_2$ gas may be higher than that of the second CF-based gas such as, for example, $C_4F_8$ gas. Further, when considering a shoulder loss amount of the silicon film 203 serving as the mask during etching of the OCOC film 202 and a degree of roughness of an inner wall surface of the trench, the flow rate of $O_2$ gas may be 5.0 or more times and 8.0 or less times the flow rate of the second CF-based gas such as $C_4F_8$ gas. When the flow rate of $O_2$ gas is less than 0.5 times the flow rate of the second CF-based gas, the shoulder loss amount becomes larger, but etching rate of the oxide film decreases. In the meantime, when the flow rate of $O_2$ gas is 8.0 or more times the flow rate of second CF-based gas, etching rate of the oxide film decreases and thus, the etching rate of the OCOC film 202 decreases. Further, the flow rate of $O_2$ gas may be 100 sccm or more and 150 sccm or less. Further, the range of the etching selectivity of the OCOC film 202 in relation to the silicon film 203 may be 2.5 or more.

Figure 14:
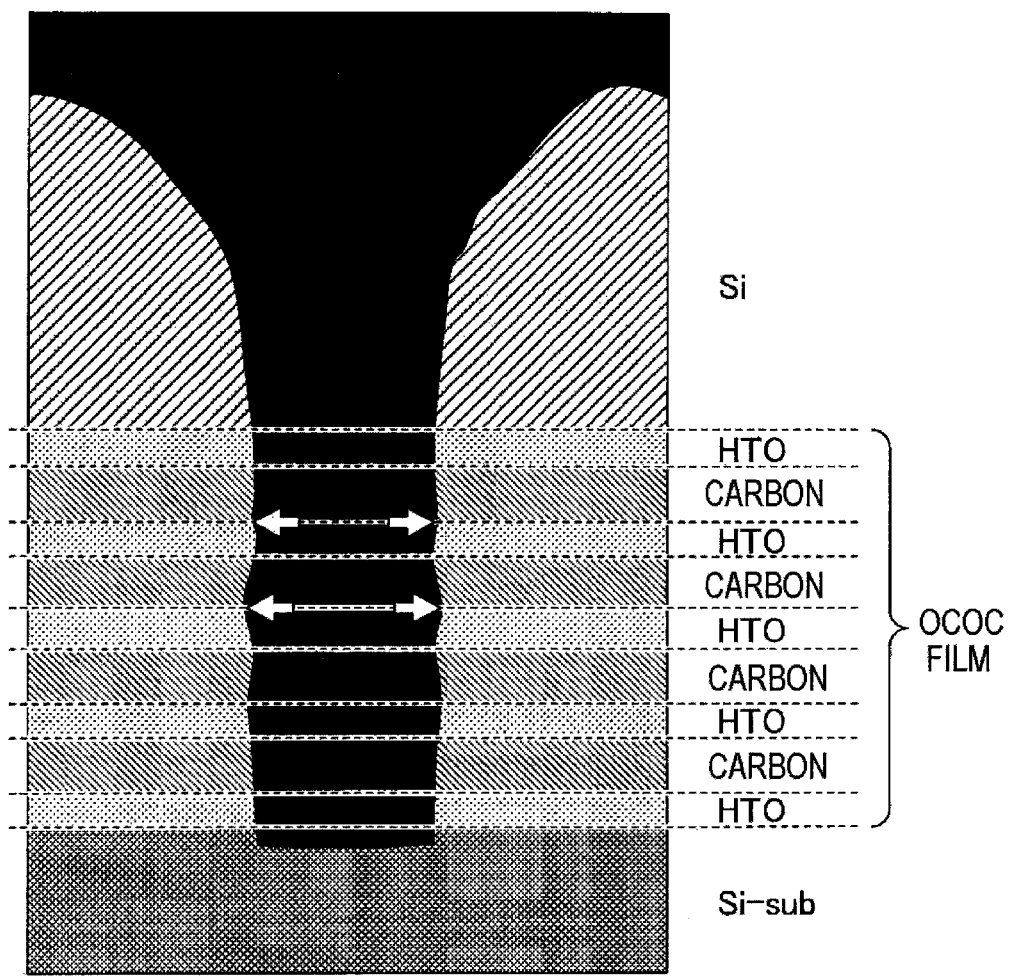
FIG. 14 is a diagram illustrating an exemplary cross-section of a wafer W in a case where etching was performed on the entirety of an OCOC film using plasma of the mixed gas containing $C_4F_8$.

However, in the etching by plasma of mixed gas containing second CF-based gas such as, for example, $C_4F_8$ gas, for example, as illustrated in FIG. 14, the degree of roughness of the sidewall of the trench formed by the etching is higher than the degree of roughness (see FIG. 9) of the sidewall of the trench formed by etching by plasma of the mixed gas containing the first CF-based gas such as, for example, $CF_4$ gas. FIG. 14 is a diagram illustrating an exemplary cross-section of a wafer W in a case where the entirety of the OCOC film 202 was etched by plasma of the mixed gas containing $C_4F_8$.

FIG. 14 illustrates an image of a cross section of the wafer W etched by plasma a mixed gas in which the flow rate of $O_2$ gas is 150 sccm. Conditions, except for the flow rate of $O_2$ gas, are the same as those explained with reference to FIG. 10. Referring to the test results of FIG. 14, even though roughness was generated in the sidewall of the trench formed by etching, no micro-trench was formed on the bottom of the trench formed on the wafer W.

[Etching Process of OCOC Film 202 in the Present Exemplary Embodiment]

Here, in the present exemplary embodiment, the OCOC film 202 is etched to the middle thereof by, for example, plasma of the mixed gas containing the first CF-based gas and oxygen gas in the first etching process (S105) illustrated in FIG. 3. Then, the first CF-based gas is switched to the second CF-based gas, and etching of the OCOC film 202 is resumed from the middle of the OCOC film 202 by plasma of the mixed gas containing the second CF-based gas and oxygen gas from in the second etching process (S106) illustrated in FIG. 3.

In the present exemplary embodiment, the control unit 100 executes the first etching process with the following condition, for example.

Pressure within chamber 10: 25 mT

First high frequency power (40.68 MHz) to be supplied to lower electrode: 300 W

Second high frequency power (13.56 MHz) to be supplied to lower electrode: 750 W Supplied gas and flow rate: $CF_4/Ar/O_2=200/400/200$ sccm Processing time: 74 seconds Further, in the present exemplary embodiment, the control unit 100 executes the second etching process with the following condition, for example.

Pressure within chamber 10: 20 mT

First high frequency power (40.68 MHz) to be supplied to lower electrode: 2500 W Second high frequency power (13.56 MHz) to be supplied to lower electrode: 800 W Supplied gas and flow rate: $C_4F_8/Ar/O_2=18/700/150$ sccm Processing time: 26 seconds Here, the switching of the CF-based gas contained in mixed gas from the first CF-based gas to the second CF-based gas may be performed while the lowermost carbon film 2021 among the plurality of carbon films 2021 included in the OCOC film 202 is being etched by the plasma of the mixed gas containing the first CF-based gas. In this manner, since the OCOC film 202 is etched by the plasma of the mixed gas containing the first CF-based gas and oxygen gas from the top surface of the OCOC film 202 to the lowermost carbon film 2021 among the plurality of carbon films 2021 included in the OCOC film 202, a trench having a less rough sidewall thereof may be formed in the OCOC film 202.

Further, the etching may be performed from the middle of the lowermost carbon film to the lower most HTO film 2020 without generating a micro-trench by switching the CF-based gas contained in the mixed gas from the first CF-based gas to the second CF-based gas while the lowermost carbon film 2021 among the plurality of carbon films 2021 included in the OCOC film 202 is being etched. In this manner, the trench having a small micro-trench may be formed in the OCOC film 202 at the step where the etching of the lowermost HTO film 2020 is finished.

Figure 15:
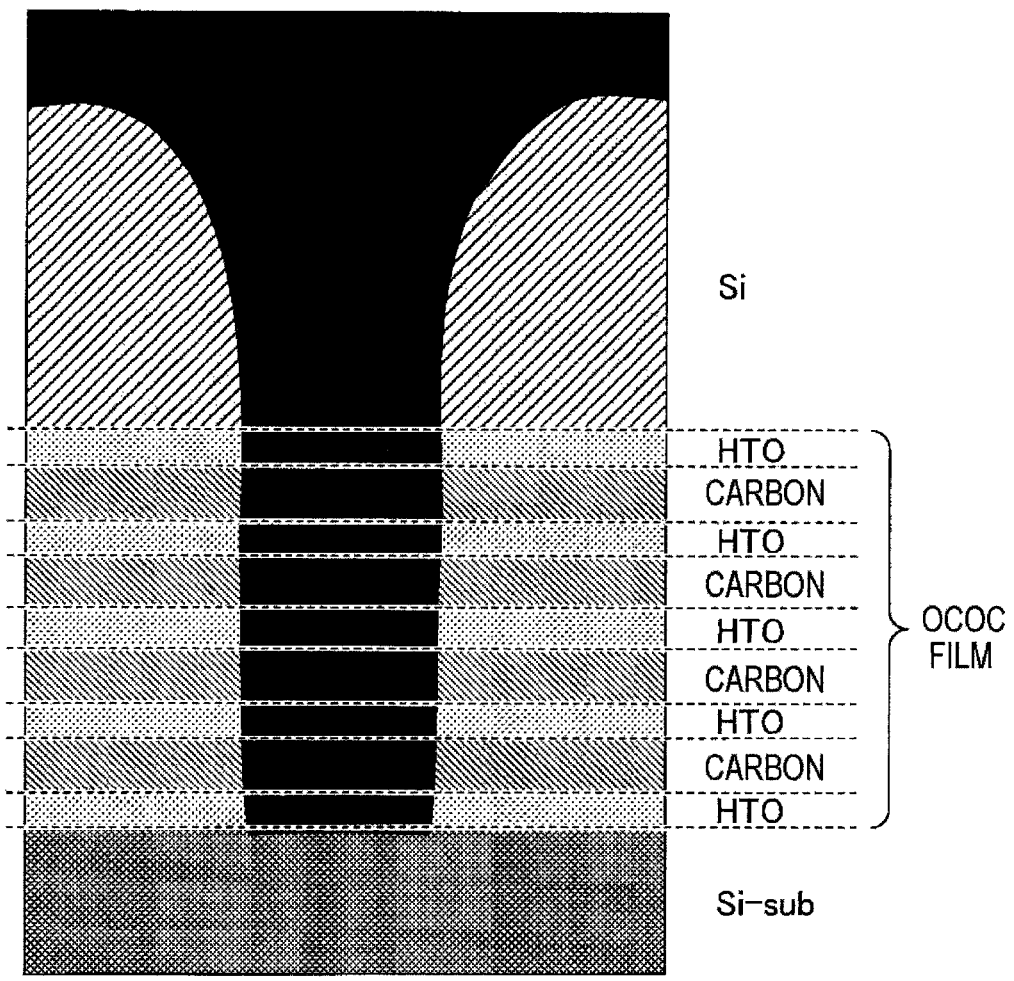
FIG. 15 is a diagram illustrating an exemplary cross-section of a wafer W in a case where etching was performed by switching from the mixed gas containing $CF_4$ gas to mixed gas containing $C_4F_8$ gas during the etching of the OCOC film.

FIG. 15 is a diagram illustrating an exemplary cross-section of a wafer W in a case where etching was performed by switching the mixed gas from the mixed gas containing $CF_4$ gas to the mixed gas containing $C_4F_8$ gas during the etching of the OCOC film 202. FIG. 15 illustrates an exemplary cross-section of a wafer W in a case where the CF-based gas contained in the mixed gas is switched from the first CF-based gas to the second CF-based gas while the lowermost carbon film 2021 among the plurality of carbon films 2021 included in the OCOC film 202 is etched by plasma of the mixed gas containing the first CF-based gas. As is evident from FIG. 15, a trench having less roughness on the sidewall thereof and less micro-trenches may be formed in the OCOC film 202 by switching the CF-based gas contained in the mixed gas from the first CF-based gas to the second CF-based gas while the lowermost carbon film 2021 among the plurality of carbon films 2021 included in the OCOC film 202 is being etched by plasma of the mixed gas containing the first CF-based gas.

In the foregoing, exemplary embodiments have been described.

According to the plasma etching apparatus 1 of the present embodiment, a trench having less roughness on the sidewall thereof and less micro-trenches may be formed in the processing target film in which the oxide films and the carbon films are alternately laminated.

The present disclosure is not limited to the exemplary embodiments described above and various modifications may be made thereto without departing from a gist of the present disclosure.

For example, in the exemplary embodiment described above, although the CF-based gas contained in the mixed gas is switched from the first CF-based gas to the second CF-based gas while the lowermost carbon film 2021 among the plurality of carbon films 2021 included in the OCOC film 202 is being etched by the plasma of the mixed gas containing the first CF-based gas, the present disclosure is not limited thereto. The control unit 100 may control, for example, the gas supply source 66 such that switching between the first CF-based gas and the second CF-based gas is performed two or more times during the etching of the OCOC film 202.

Further, the control unit 100 may control, for example, the gas supply source 66 such that the switching between the first CF-based gas and the second CF-based gas is performed whenever the bottom of the trench formed by the etching reaches a carbon film 2021 in the OCOC film 202 in which HTO films 2020 and carbon films 2021 are alternately laminated. For example, the control unit 100 may repeat an operation which resumes etching by switching the CF-based gas contained in the mixed gas from the first CF-based gas to the second CF-based gas when the bottom of the trench formed by the etching by plasma of the mixed gas containing first CF-based gas and oxygen gas reaches a carbon film 2021 and an operation which resumes etching by switching the CF-based gas contained in the mixed gas from the second CF-based gas to the first CF-based gas when the bottom of the trench formed by the etching by plasma of the mixed gas containing second CF-based gas and oxygen gas reaches a next carbon film 2021.

In the OCOC film 202 in which the HTO films 2020 and the carbon films 2021 are alternately laminated, the control unit 100 may etch the OCOC film 202 while switching the CF-based gas contained in the mixed gas between first CF-based gas and second CF-based gas such that the HTO film 2020 is etched by the plasma of the mixed gas containing the first CF-based gas and oxygen gas and the carbon film 2021 is etched by the plasma of the mixed gas containing second CF-based gas and oxygen gas.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A plasma etching method for etching a processing target film formed on a silicon substrate using a silicon film formed on the processing target film as a mask, the plasma etching method comprising:

performing a first etching to etch the processing target film, in which an oxide film and a carbon film are alternately laminated, to a position of the processing target film in a film thickness direction by plasma of a mixed gas containing (i) a first CF-based gas in which a content ratio of C (carbon) in relation to F (fluorine) is predetermined and (ii) an oxygen gas;

after performing the first etching, changing the first CF-based gas to a second CF-based gas in which a content ratio of C (carbon) in relation to F (fluorine) is higher than the predetermined ratio of the first CF-based gas; and performing a second etching to etch the processing target film from the position of the processing target film in the film thickness direction by plasma of the mixed gas containing the second CF-based gas and oxygen gas.

2. The plasma etching method of claim 1, wherein the processing target film includes an oxide film formed on a lowermost layer thereof, and the first etching is performed in the film thickness direction to a position of a lowermost carbon film among a plurality of carbon films included in the processing target film, and then, the second etching is performed in the film thickness direction from the position of the lowermost carbon film to the oxide film of the lowermost layer.

3. The plasma etching method of claim 1, wherein a plurality of oxide films and a plurality of carbon films are alternately laminated in the processing target film, and the processing target film is etched by alternately repeating the first etching process and the second etching process plural times in the etching of the processing target film.

4. The plasma etching method of claim 3, wherein the plurality of oxide films is etched by the first etching and the plurality of carbon films is etched by the second etching in the etching of the processing target film.

5. The plasma etching method of claim 1, wherein the content ratio of C (carbon) in relation to F (fluorine) in the first CF-based gas is 0.33 or less.

6. The plasma etching method of claim 1, wherein the content ratio of C (carbon) in relation to F (fluorine) in the second CF-based gas is 0.33 or more.

7. The plasma etching method of claim 1, wherein the second etching is performed under a condition in which an etching rate of the carbon film is higher than that of the oxide film.

8. The plasma etching method of claim 1, wherein, when the first CF-based gas is contained in the mixed gas, a flow rate of the oxygen gas is 1.0 or more times a flow rate of the first CF-based gas, and when the second CF-based gas is contained in the mixed gas, a flow rate of the oxygen gas is 5.0 or more times a flow rate of the second CF-based gas.

9. The plasma etching method of claim 1, wherein the first CF-based gas is $CF_4$ gas.

10. The plasma etching method of claim 1, wherein the second CF-based gas is any one of $C_4F_6$ gas, $C_4F_8$ gas, and $C_5F_8$ gas.

11. The plasma etching method of claim 1, wherein a switching between the first CF-based gas and the second CF-based gas is performed whenever a bottom of a trench formed by the first etching and the second etching reaches the carbon film in the processing target film.

12. The plasma etching method of claim 1, wherein the oxide film and carbon film are alternately laminated a plurality of times in the target film.

13. The plasma etching method of claim 12, wherein a number of carbon films in the target film is one less than a number of oxide films in the target film.

14. The plasma etching method of claim 12, wherein the target film includes oxide films on the top and bottom of the target film.

15. The plasma etching method of claim 1, wherein the target film is in direct contact with the silicon substrate.

* * * * *